(12) United States Patent
Adams et al.

(10) Patent No.: US 8,030,709 B2
(45) Date of Patent: Oct. 4, 2011

(54) METAL GATE STACK AND SEMICONDUCTOR GATE STACK FOR CMOS DEVICES

(75) Inventors: Charlotte D. Adams, Poughkeepsie, NY (US); Bruce B. Doris, Brewster, NY (US); Philip Fisher, Fishkill, NY (US); William K. Henson, Beacon, NY (US); Jeffrey W. Sleight, Ridgefield, CT (US)

(73) Assignees: International Business Machines Corporation, Armonk, NY (US); Globalfoundries, Inc., Grand Cayman (KY)

( * ) Notice: Subject to any disclaimer, the term of this patent is extended or adjusted under 35 U.S.C. 154(b) by 164 days.

(21) Appl. No.: 11/954,918

(22) Filed: Dec. 12, 2007

(65) Prior Publication Data
US 2009/0179283 A1    Jul. 16, 2009

(51) Int. Cl.
H01L 21/70    (2006.01)
H01L 27/148   (2006.01)
H01L 27/12    (2006.01)
H01L 21/84    (2006.01)
H01L 21/338   (2006.01)

(52) U.S. Cl. ........ 257/369; 257/250; 257/351; 257/411; 257/E27.064; 257/E29.064; 438/154; 438/157; 438/169; 438/199; 438/216

(58) Field of Classification Search .......... 257/411, 257/E21.409, 250, 351, 369, E29.264, E27.064; 438/595, 154, 157, 169, 199, 216
See application file for complete search history.

(56) References Cited

U.S. PATENT DOCUMENTS

| | | | |
|---|---|---|---|
| 6,057,583 A * | 5/2000 | Gardner et al. | 257/408 |
| 6,194,748 B1 * | 2/2001 | Yu | 257/216 |
| 6,468,851 B1 | 10/2002 | Ang et al. | |
| 6,518,106 B2 * | 2/2003 | Ngai et al. | 438/157 |
| 6,908,822 B2 * | 6/2005 | Rendon et al. | 438/303 |
| 7,067,411 B2 | 6/2006 | Schuegraf et al. | |
| 2002/0175384 A1 * | 11/2002 | Ngai et al. | 257/408 |
| 2004/0026734 A1 | 2/2004 | Clevenger et al. | |
| 2006/0134844 A1 | 6/2006 | Le et al. | |
| 2006/0166424 A1 * | 7/2006 | Schaeffer et al. | 438/199 |
| 2007/0111453 A1 * | 5/2007 | Lee et al. | 438/283 |
| 2007/0228480 A1 * | 10/2007 | Yen et al. | 257/369 |
| 2007/0272975 A1 * | 11/2007 | Schaeffer et al. | 257/327 |
| 2008/0099851 A1 * | 5/2008 | Hsu et al. | 257/369 |
| 2008/0272438 A1 * | 11/2008 | Doris et al. | 257/369 |
| 2009/0039441 A1 * | 2/2009 | Luna et al. | 257/383 |

* cited by examiner

*Primary Examiner* — Zandra Smith
*Assistant Examiner* — Jeremy Joy
(74) *Attorney, Agent, or Firm* — Scully, Scott, Murphy & Presser, P.C.; Joseph P. Abate, Esq.

(57) ABSTRACT

A semiconductor gate stack comprising a silicon oxide based gate dielectric and a doped semiconductor material is formed on a semiconductor substrate. A high-k material metal gate electrode comprising a high-k gate dielectric and a metal gate portion is also formed on the semiconductor substrate. Oxygen-impermeable dielectric spacers are formed on the sidewalls of the semiconductor gate stack and the high-k material metal gate stack. The oxygen-impermeable dielectric spacer on the semiconductor gate stack is removed, while the oxygen impermeable dielectric spacer on the high-k material metal gate electrode is preserved. A low-k dielectric spacer is formed on the semiconductor gate stack, which provides a low parasitic capacitance for the device employing the semiconductor gate stack.

12 Claims, 19 Drawing Sheets

METAL GATE STACK AND SEMICONDUCTOR GATE STACK FOR CMOS DEVICES

FIELD OF THE INVENTION

The present invention generally relates to semiconductor devices, and particularly to complementary metal-oxide-semiconductor (CMOS) devices having a metal gate stack transistor and a semiconductor gate stack transistor, and methods of manufacturing the same.

BACKGROUND OF THE INVENTION

Complementary metal oxide semiconductor (CMOS) integration requires two gate materials, one having a work function near the valence band edge of the semiconductor material in the channel and the other having a work function near the conduction band edge of the same semiconductor material. In CMOS devices having a silicon channel, a conductive material having a work function of about 4.0 eV is necessary for n-type metal oxide semiconductor field effect transistors (NMOSFETs) and another conductive material having a work function of about 5.0 eV is necessary for p-type metal oxide semiconductor field effect transistors (PMOSFETs).

In conventional CMOS devices employing polysilicon gate materials, a heavily p-doped polysilicon gate and a heavily n-doped polysilicon gate are employed to address the needs. In CMOS devices employing high-k gate dielectric materials, suitable materials satisfying the work function requirements are needed. So far, identification of materials for a dual work function metal gate electrode system has presented some challenges. In particular, a high-k material metal gate stack for p-type field effect transistors that is capable of withstanding a high temperature thermal cycling encountered during a conventional semiconductor processing sequence has proven to be illusive so far.

Due to the difficulties encountered in providing suitable materials for a pair of dual work function metal gate electrode system, hybrid implementation of a high-k metal gate and a conventional polysilicon gate has been known in the art, in which a high-k material metal gate is employed for one type of transistors, i.e., n-type field effect transistors, and a conventional polysilicon gate is employed for another type of transistors, i.e., p-type field effect transistors. However, integration of the two types of gate electrodes introduces difficulties since the two types of gates have different requirements for spacer structures. On one hand, a low-k dielectric spacer or an oxide spacer is desirable on a polysilicon gate electrode to reduce parasitic capacitance between the polysilicon gate electrode and the source and drain regions. On the other hand, a high-k material metal gate requires protection of the high-k material from subsequent oxidation since an unstable oxygen content in the high-k gate dielectric degrades or introduces uncertainty in the dielectric constant of the high-k material.

In view of the above, there exists a need for a semiconductor structure providing a high-k material metal gate and a semiconductor gate electrode, while providing stability of the composition of the high-k material as well as a low parasitic capacitance for the semiconductor gate electrode, and methods of manufacturing the same.

SUMMARY OF THE INVENTION

The present invention addresses the needs described above by providing a CMOS structure including a diffusion barrier layer directly on the sidewalls a high-k material metal gate electrode and a low-k spacer directly on the sidewalls of a semiconductor gate electrode, and methods of manufacturing the same.

A semiconductor gate stack comprising a silicon oxide based gate dielectric and a doped semiconductor material is formed on a semiconductor substrate. A high-k material metal gate electrode comprising a high-k gate dielectric and a metal gate portion is also formed on the semiconductor substrate. Oxygen-impermeable dielectric spacers are formed on the sidewalls of the semiconductor gate stack and the high-k material metal gate stack. The oxygen-impermeable dielectric spacer on the semiconductor gate stack is removed, while the oxygen impermeable dielectric spacer on the high-k material metal gate electrode is preserved. A low-k dielectric spacer is formed on the semiconductor gate stack, which provides a low parasitic capacitance for the device employing the semiconductor gate stack.

According to an embodiment of the present invention, a semiconductor structure is provided, which comprises a high-k material metal gate structure and a semiconductor gate structure, wherein the high-k material metal gate structure includes:

a high dielectric constant (high-k) material portion having a dielectric constant greater than 8.0 and located on a semiconductor substrate;

a metal gate portion comprising a metal and vertically abutting the high-k material portion; and an oxygen-impermeable dielectric spacer laterally abutting sidewalls of the high-k material portion and the metal gate portion;

and wherein the semiconductor gate structure includes:

a semiconductor oxide containing gate dielectric portion having a dielectric constant less than 8.0 and located directly on the semiconductor substrate;

a doped semiconductor portion comprising a doped semiconductor material and vertically abutting the gate dielectric; and a low-k gate spacer comprising a dielectric material having a dielectric constant less than 4.0 and laterally abutting sidewalls of the semiconductor oxide containing gate dielectric portion and the doped semiconductor portion.

In one embodiment, the high-k material portion further includes a chemical oxide portion vertically abutting the high-k material portion and the semiconductor substrate and comprising an oxide of a semiconductor material of the semiconductor substrate.

In another embodiment, the oxygen-impermeable dielectric spacer has an L-shaped vertical cross-sectional area and vertically abuts the semiconductor substrate.

In even another embodiment, the semiconductor structure further comprises another low-k gate spacer abutting the oxygen-impermeable dielectric spacer.

In yet another embodiment, the oxygen-impermeable dielectric spacer comprises silicon nitride.

In Still Another Embodiment, the Low-K Gate Spacer Comprises Silicon Oxide.

In still yet another embodiment, the low-k gate spacer comprises a low-k dielectric material having a dielectric constant less than 2.8.

In a further embodiment, the high-k material portion comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from about 0.5 to about 3 and each value of y is independently from 0 to about 2.

In an even further embodiment, the metal gate portion comprises one of TiN, ZrN, HfN, VN, NbN, TaN, WN, TiAlN, TaCN, W, Ta, Ti, other conductive refractory metal nitrides, and an alloy thereof.

In a yet further embodiment, the high-k material metal gate structure further includes a second doped semiconductor portion comprising a doped semiconductor and vertically abutting the metal gate portion.

In a still further embodiment, the semiconductor gate structure further includes a third doped semiconductor portion comprising the doped semiconductor and vertically abutting the doped semiconductor portion.

In a still yet further embodiment, the third doped semiconductor portion and the doped semiconductor portion comprise different materials.

According to another aspect of the present invention, a method of forming a semiconductor structure is provided, which comprises:

forming a first gate structure and a second gate structure on a semiconductor substrate, wherein the first gate structure includes a high dielectric constant (high-k) material portion having a dielectric constant greater than 8.0, and wherein the second gate structure includes a semiconductor oxide containing gate dielectric portion having a dielectric constant less than 8.0;

forming an oxygen-impermeable dielectric layer over the first gate structure and the second gate structure; and removing a first portion of the oxygen-impermeable dielectric layer over the second gate structure, while protecting a second portion the oxygen-impermeable dielectric layer over the first gate structure.

In one embodiment, the method further comprises forming a low-k spacer having a dielectric constant less than 4.0 directly on sidewalls of the second gate stack and the second portion of the oxygen-impermeable dielectric layer.

In another embodiment, the method further comprises forming another low-k spacer having a dielectric constant less than 4.0 directly on sidewalls of the oxygen-impermeable dielectric layer over the first gate structure.

In even another embodiment, the method further comprises etching the second portion of the oxygen-impermeable dielectric layer to form an oxygen-impermeable dielectric spacer.

In yet another embodiment, the oxygen-impermeable dielectric spacer comprises silicon nitride and has an L-shaped cross-sectional area.

In still another embodiment, the first gate structure further includes a metal gate portion comprising a metal and vertically abutting the high-k material portion, and the second gate structure further includes a first doped semiconductor portion comprising a doped semiconductor material and vertically abutting the semiconductor oxide containing gate dielectric portion.

In still yet another embodiment, the first gate structure further includes a chemical oxide portion vertically abutting the high-k material portion and the semiconductor substrate and comprising an oxide of a semiconductor material of the semiconductor substrate.

In a further embodiment, the method further comprises:

forming a second doped semiconductor portion directly on the metal gate portion; and forming a third doped semiconductor portion directly on the first doped semiconductor material portion, wherein the second doped semiconductor portion and the third doped semiconductor portion have an identical composition.

DETAILED DESCRIPTION OF THE INVENTION

Figure 1:
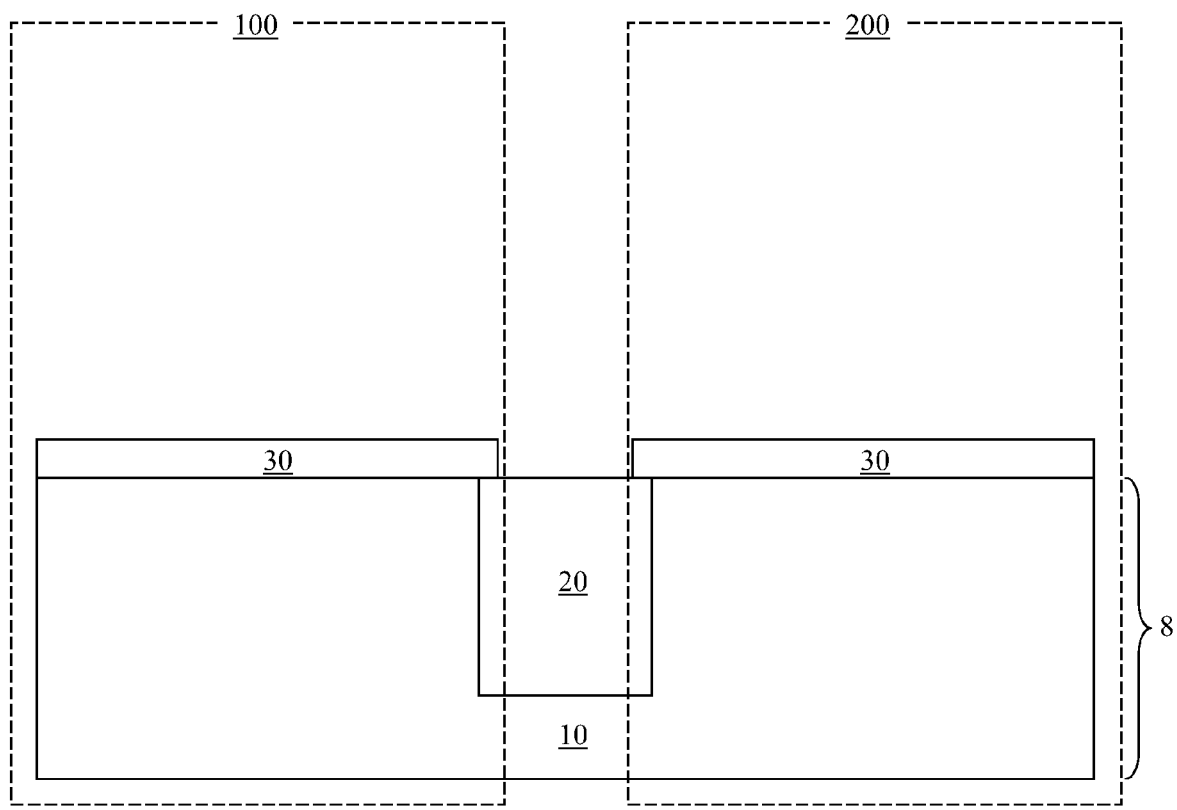
FIGS. 1-19 are sequential vertical cross-sectional views of an exemplary semiconductor structure according to the present invention at various stages of a manufacturing process.

As stated above, the present invention relates to complementary metal-oxide-semiconductor (CMOS) devices having a metal gate stack transistor and a semiconductor gate stack transistor, and methods of manufacturing the same, which are now described in detail with accompanying figures. It is noted that like and corresponding elements are referred to by like reference numerals.

Referring to FIG. 1, an exemplary semiconductor structure according to the present invention is shown, which comprises a semiconductor substrate 8 containing a substrate semiconductor layer 10 and a shallow trench isolation structure 20. The substrate semiconductor layer 10 comprises a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon. Preferably, the substrate semiconductor layer 10 is single crystalline. The semiconductor substrate 8 may be a bulk substrate, a semiconductor-on-insulator (SOI) substrate, or a hybrid substrate. The semiconductor substrate 8 may have a built-in stress in the substrate semiconductor layer 10. While the present invention is described with a bulk substrate, implementation of the present invention on an SOI substrate or on a hybrid substrate is explicitly contemplated herein.

The shallow trench isolation structure 20 comprises a dielectric material such as silicon oxide or silicon nitride, and is formed by methods well known in the art. The exemplary semiconductor structure comprises an n-type field effect transistor (NFET) region 100, in which an n-type metal oxide semiconductor field effect transistor (NMOSFET) is to be formed, and a p-type field effect transistor (PFET) region 200, in which a p-type metal oxide semiconductor field effect transistor (PMOSFET) is to be formed. Each of the NFET region 100 and the PFET region 200 comprises a non-overlapping portion of a substrate semiconductor layer 10. The portion of the substrate semiconductor layer 10 in the NFET region 100 is electrically isolated from the portion of the substrate semiconductor layer 10 in the PFET region 200 above the bottom surface of the shallow trench isolation structure 20 by the shallow trench isolation structure 20.

A sacrificial semiconductor oxide layer 30 is formed on the top surfaces of the substrate semiconductor layer 10 in the NFET region 100 and the PFET region 200. The sacrificial semiconductor oxide layer 30 may be formed by thermal oxidation of the semiconductor material in the substrate semiconductor layer 10, or by chemical vapor deposition (CVD). In case the substrate semiconductor layer 10 comprises silicon, the sacrificial semiconductor oxide layer 30 comprises silicon oxide. The thickness of the sacrificial semiconductor oxide layer 30 may be from 2 nm to about 20 nm, and typically from about 3 nm to about 10 nm.

Figure 2:
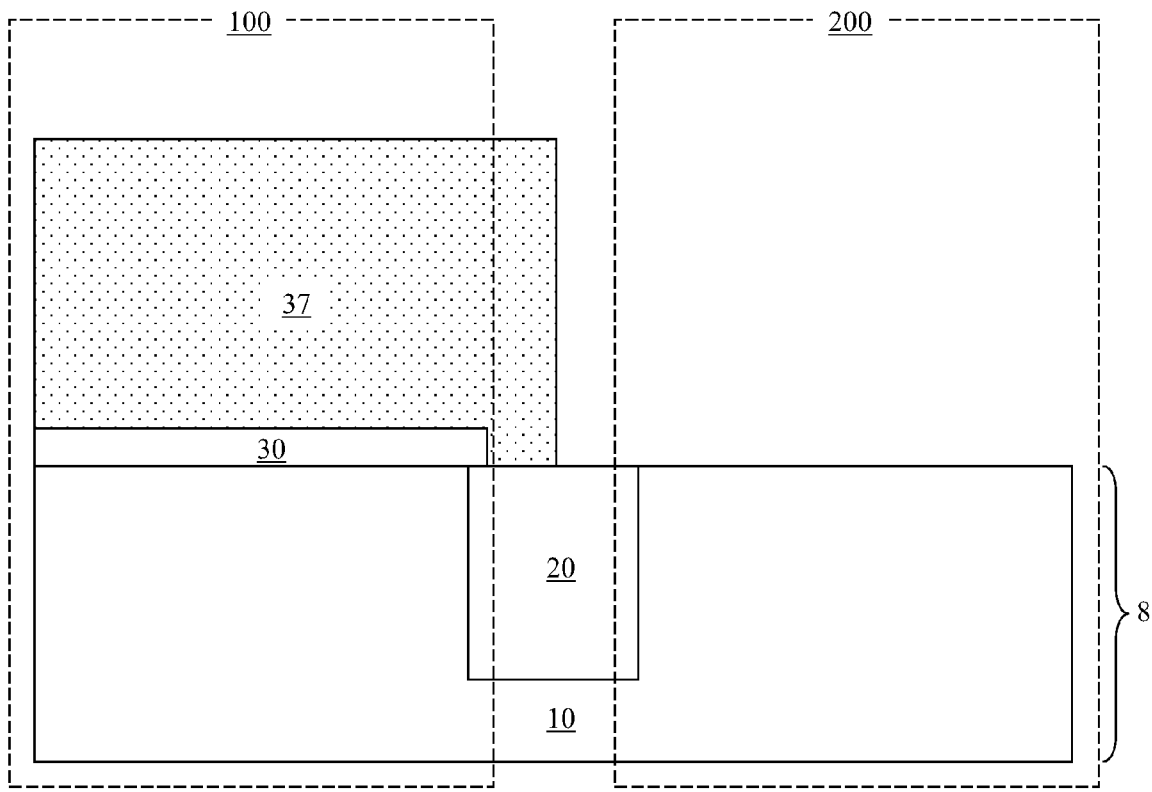

Referring to FIG. 2, a first photoresist 37 is applied over the sacrificial semiconductor oxide layer 30 and lithographically patterned to expose the portion of the sacrificial semiconductor oxide layer 30 in the PFET region 200, while covering the portion of the sacrificial semiconductor oxide layer 30 in the NFET region 100. The exposed portion of the sacrificial semiconductor layer 30 in the PFET region is removed by an etch, which may be a dry etch or a wet etch. In case the sacrificial semiconductor oxide layer 30 comprises silicon oxide, a hydrofluoric acid (HF) based wet etch may be employed to remove the sacrificial semiconductor oxide layer 30. The first photoresist 37 is subsequently removed.

Figure 3:
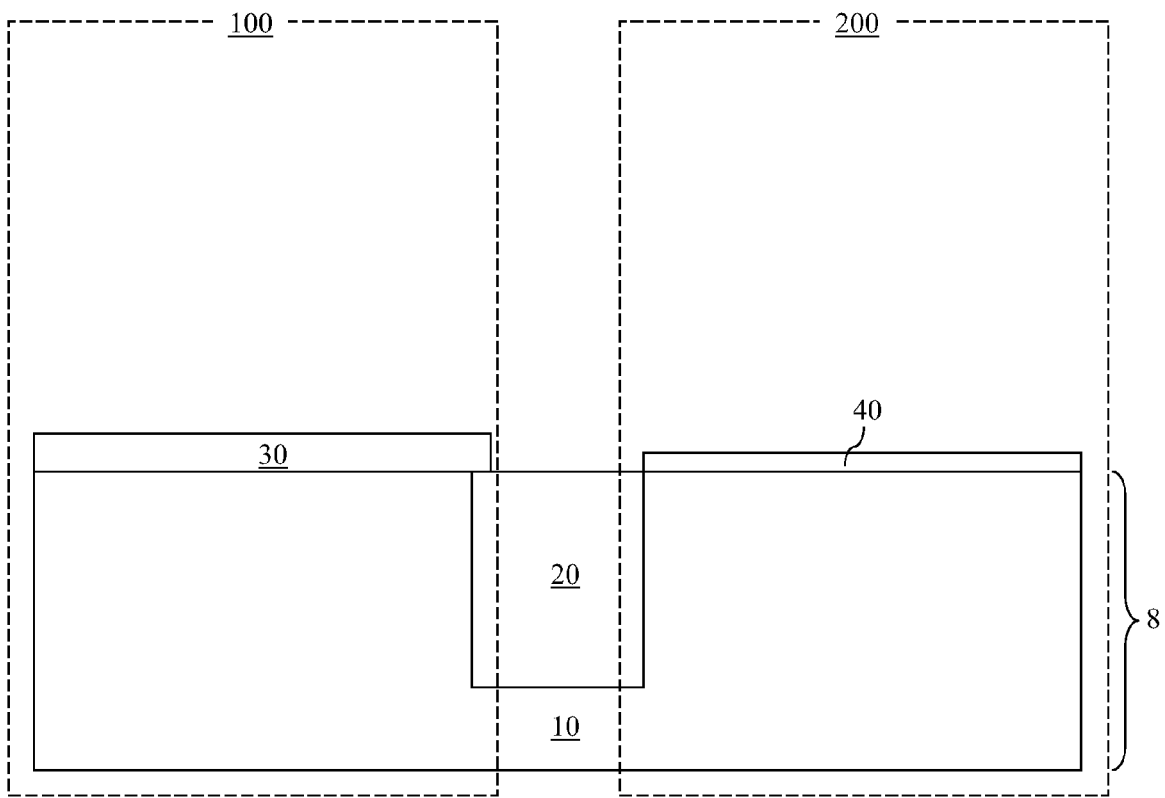

Referring to FIG. 3, a semiconductor oxide containing gate dielectric layer 40 is formed on exposed surfaces of the substrate semiconductor layer 10. The semiconductor oxide containing gate dielectric layer 40 comprises an oxide of the semiconductor material of the substrate semiconductor layer 10. The semiconductor oxide containing gate dielectric layer 40 may be a layer of an oxide or an oxynitride of the semiconductor material of the substrate semiconductor layer 10. Alternately, the semiconductor oxide containing gate dielectric layer 40 may be a stack of multiple dielectric layers in which one layer comprises an oxide of the semiconductor material of the substrate semiconductor layer 10. In case the substrate semiconductor layer 10 comprises silicon, the semiconductor oxide containing gate dielectric layer 40 comprises silicon oxide or silicon oxynitride.

Preferably, the semiconductor oxide containing gate dielectric layer 40 has a dielectric constant less than 8.0. For example, the semiconductor oxide containing gate dielectric layer 40 may be silicon oxide which has a dielectric constant of about 3.9 or a silicon oxynitride which has a dielectric constant between the dielectric constant of silicon oxide, which is 3.9, and the dielectric constant of silicon nitride, which is 7.5. The thickness of the semiconductor oxide containing gate dielectric layer 40 may be optimized for performance as a gate dielectric, and may be from about 1.0 nm to about 6.0 nm, and typically from about 1.2 nm to about 2.5 nm, although lesser and greater thicknesses are also explicitly contemplated herein.

Figure 4:
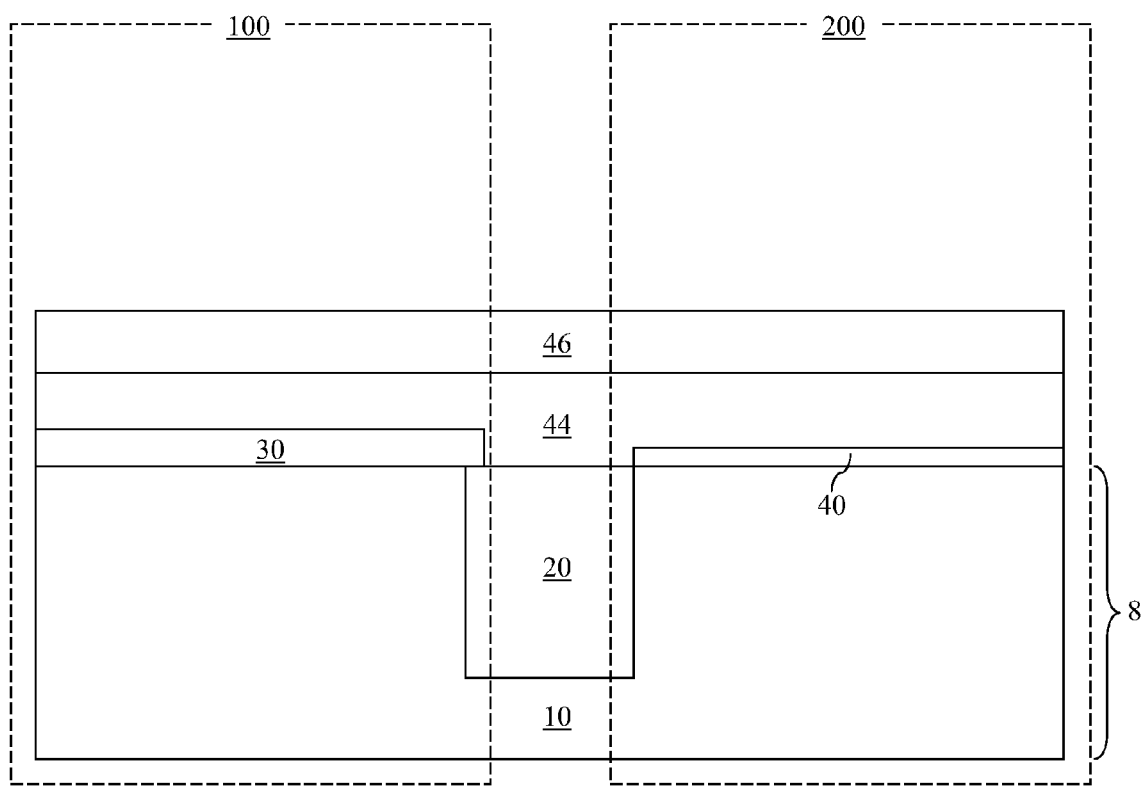

Referring to FIG. 4, a first doped semiconductor layer 44 is formed directly on the top surface of the sacrificial semiconductor oxide layer 30 in the NFET region 100 and on the top surface of the oxide containing gate dielectric layer 40 in the PFET region 200 by chemical vapor deposition (CVD) such as low pressure chemical vapor deposition (LPCVD), rapid thermal chemical vapor deposition (RTCVD), plasma enhanced chemical vapor deposition (PECVD), etc. The first doped semiconductor layer 44 may be formed by deposition of an undoped layer of semiconductor layer followed by implantation of dopants, or more preferably, may be formed by deposition of in-situ doped layer of a semiconductor material. The first doped semiconductor layer 44 may be amorphous or polycrystalline, and comprises a semiconductor material such as silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The thickness of the first doped semiconductor layer 44 may be from about 10 nm to about 100 nm, and typically from about 20 nm to about 60 nm, although lesser and greater thicknesses are also explicitly contemplated herein.

An etchstop dielectric layer 46 is formed on the first doped semiconductor layer 44 by chemical vapor deposition (CVD) such as LPCVD, RTCVD, PECVD, etc. The etchstop dielectric layer 46 comprises a dielectric material such as dielectric oxide or dielectric nitride. For example, the etchstop dielectric layer 46 may comprise silicon oxide. The thickness of the etchstop dielectric layer 46 may be from 5 nm to about 50 nm, and preferably from about 10 nm to about 20 nm, although lesser and greater thicknesses are also explicitly contemplated herein. The etchstop dielectric layer 46 is a stopping layer for an etch to be subsequently performed.

Figure 5:
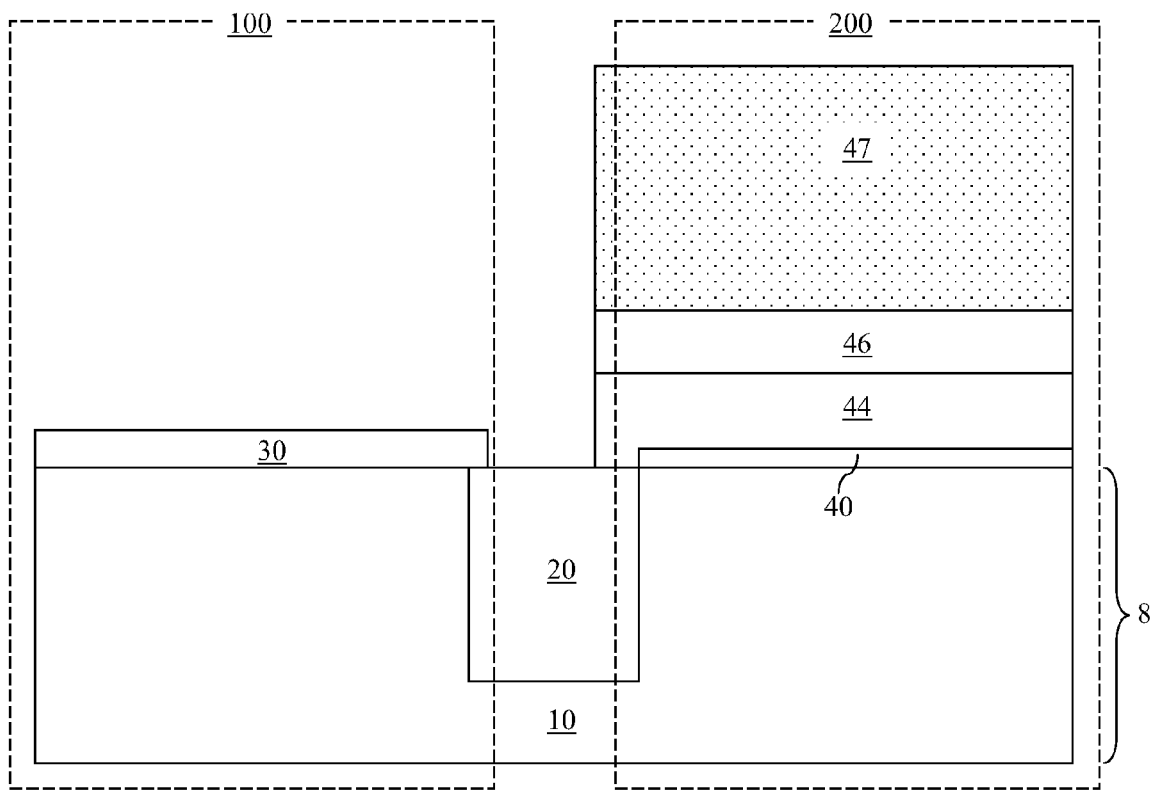

Referring to FIG. 5, a second photoresist 47 is applied over a top surface of the etchstop dielectric layer 46 and lithographically patterned to cover the PFET region 200, while exposing the NFET region 100. The pattern in the second photoresist 47 is transferred into the stack of the etchstop dielectric layer 46 and the first doped semiconductor layer 44 by an anisotropic etch so that exposed portions of the etchstop dielectric layer 46 and the first doped semiconductor layer 44 are removed in the NFET region 100. Preferably, the anisotropic etch is selective to the sacrificial semiconductor oxide layer 30.

Figure 6:
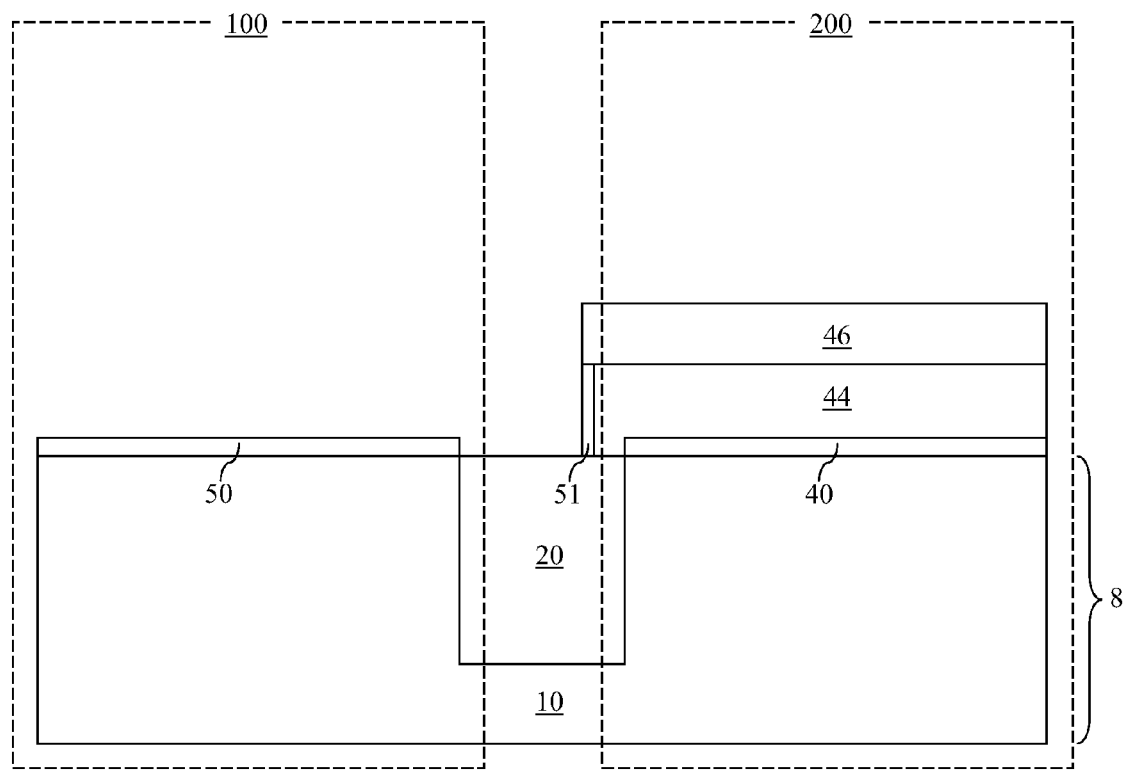

Referring to FIG. 6, the second photoresist 47 is removed, for example, by ashing. A chemical oxide is formed on exposed semiconductor surfaces including the top surface of the substrate semiconductor layer 10, on which a chemical oxide layer 50 is formed, and a sidewall of the first doped semiconductor layer 44, on which a vertical chemical oxide portion 51 is formed. The chemical oxide layer 50 and the vertical chemical oxide portion 51 may be formed by treatment of exposed semiconductor surfaces with a chemical. For example, the process step for this wet chemical oxidation may include treating a cleaned semiconductor surface (such as a semiconductor surface treated with hydrofluoric acid) with a mixture of ammonium hydroxide, hydrogen peroxide and water (in a 1:1:5 ratio) at 65° C. Alternately, the chemical oxide layer can also be formed by treating the HF-last semiconductor surface in ozonated aqueous solutions, with the ozone concentration usually varying from, but not limited to: 2 parts per million (ppm) to 40 ppm.

Figure 7:
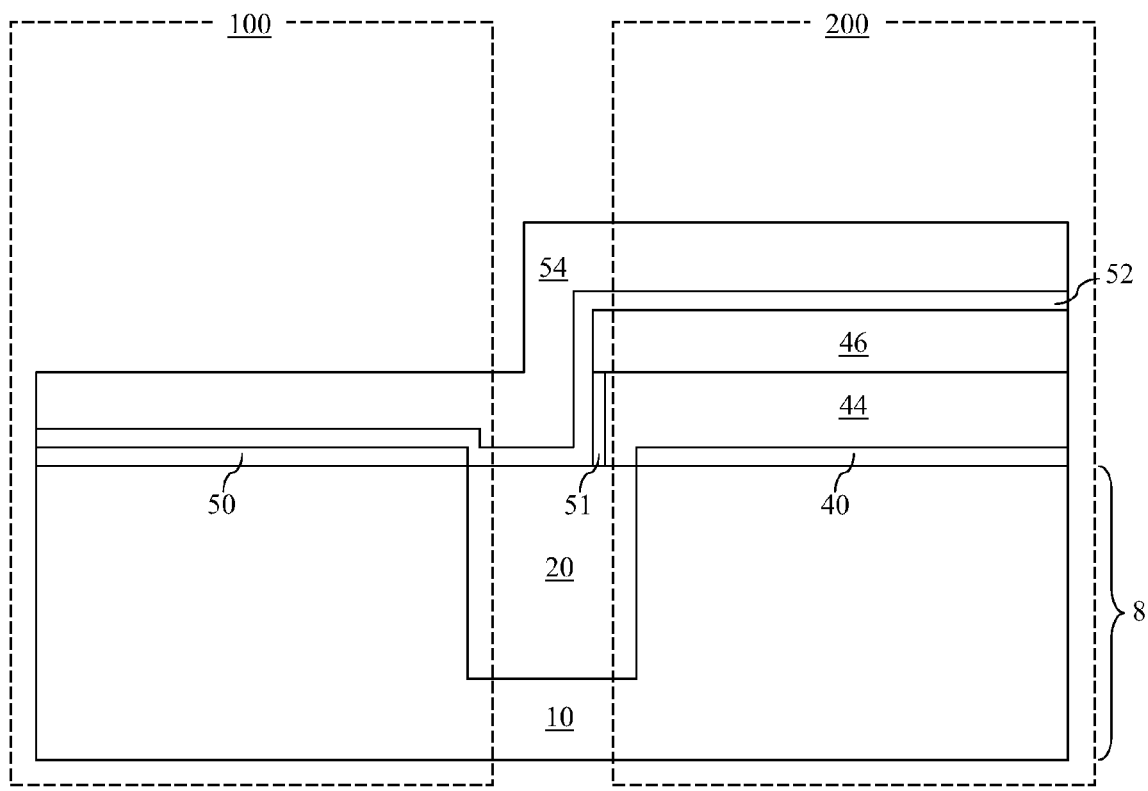

Referring to FIG. 7, a high dielectric constant (high-k) material layer 52 is formed by methods well known in the art including, for example, a chemical vapor deposition (CVD), an atomic layer deposition (PVD), molecular beam deposition (MBD), pulsed laser deposition (PLD), liquid source misted chemical deposition (LSMCD), etc. The high-k material layer 52 comprises a dielectric metal oxide having a dielectric constant that is greater than the dielectric constant of silicon nitride of 7.5. Preferably, the high-k material layer 52 comprises a dielectric material having a dielectric constant greater than 8.0.

The dielectric metal oxide is a high-k material containing a metal and oxygen, and is known in the art as high-k gate dielectric materials. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The thickness of the high-k material layer 52 may be from about 0.9 nm to about 6 nm, and preferably from about 1.2 nm to about 3 nm. The high-k material layer 52 may have an effective oxide thickness on the order of or less than 1 nm.

A metal gate layer 54 is formed directly on the high-k material layer 52, for example, by chemical vapor deposition (CVD), physical vapor deposition (PVD), atomic layer deposition (ALD), etc. The metal gate layer 54 comprises a conductive refractory metal nitride. For example, the metal gate layer 54 may comprise a material such as TaN, TiN, WN, TiAlN, TaCN, other conductive refractory metal nitride, or an alloy thereof. The thickness of the metal gate layer 54 may be from about 5 nm to about 40 nm, and preferably from about 7 nm to about 20 nm. The composition of the metal gate layer 54 may be selected to optimize threshold voltages of devices to be subsequently formed in the NFET region 100 and the PFET region 200.

Figure 8:
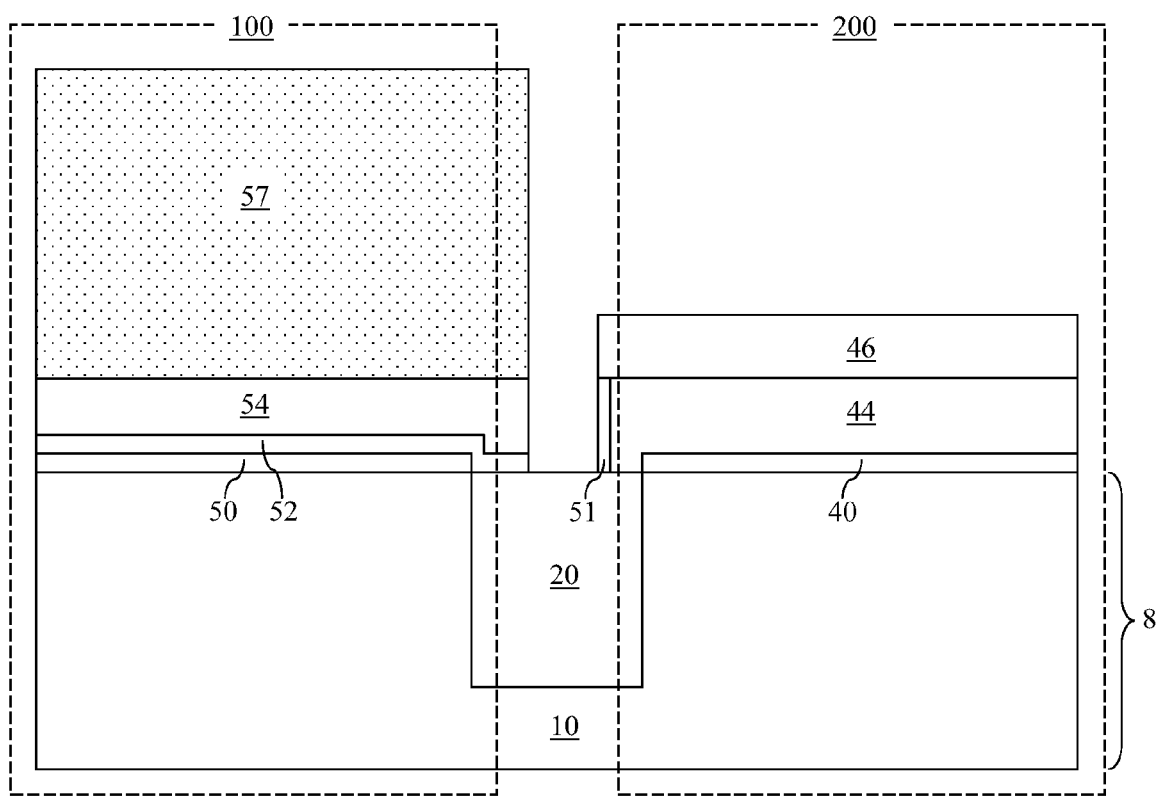

Referring to FIG. 8, a third photoresist 57 is applied over the metal gate layer 54 and lithographically patterned to cover the portion of the metal gate layer 54 in the NFET region 100, while exposing the portion of the metal gate layer 54 in the PFET region. An anisotropic etch removes the exposed portions of the metal gate layer 54 and the high-k material layer 52 in the PFET region 200. Preferably, the anisotropic etch is selective to the etchstop dielectric layer 46. Preferably, the anisotropic etch is also selective the shallow trench isolation structure 20. The third photoresist 57 is subsequently removed. The etchstop dielectric layer 46 is then removed, for example, by a wet etch. For example, the etchstop dielectric layer 46 may comprise silicon oxide and the wet etch may employ a hydrofluoric acid (HF) based solution.

Figure 9:
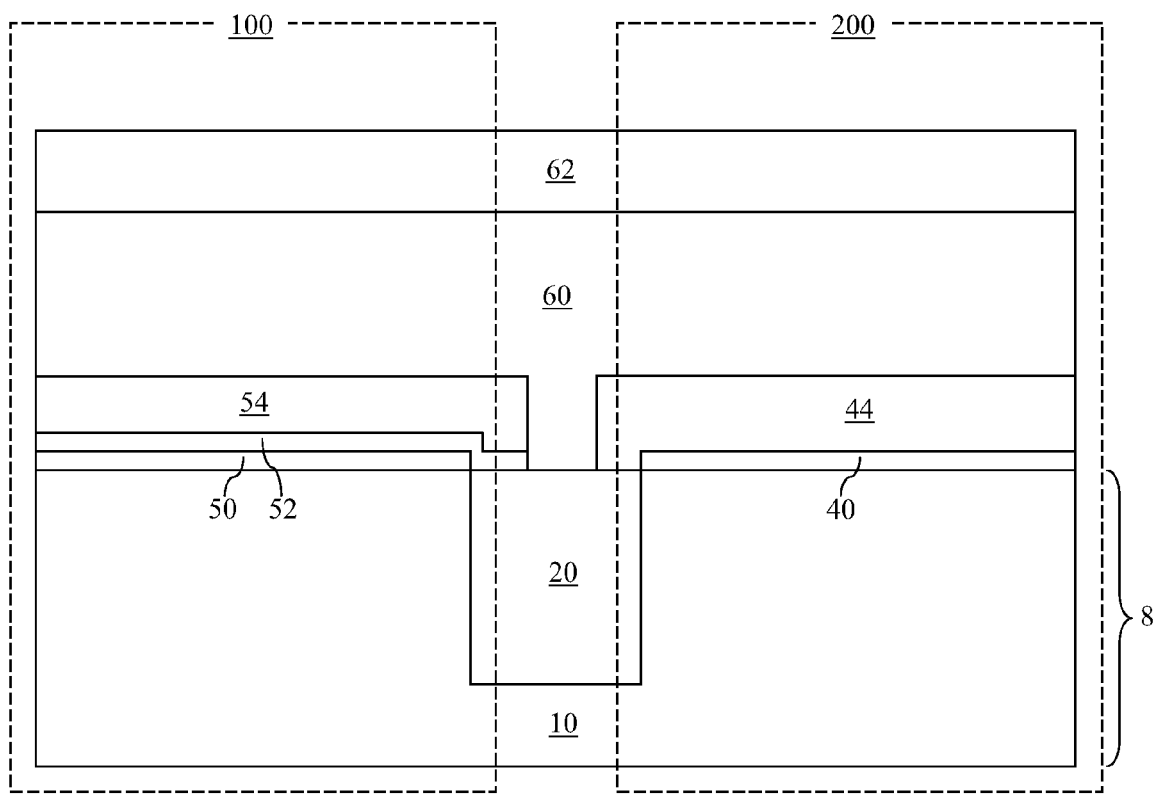

Referring to FIG. 9, a second doped semiconductor layer 60 is formed directly on the metal gate layer 54 and the first doped semiconductor layer 44 by chemical vapor deposition (CVD) such as LPCVD, RTCVD, PECVD, etc. The second doped semiconductor layer 60 may be formed by deposition of an undoped layer of semiconductor layer followed by implantation of dopants, or may be formed by deposition of in-situ doped layer of a semiconductor material. In case an undoped semiconductor layer is formed first, the portion in the NFET region 100 and the portion in the PFET region 200 may be implanted with different dopants by sequential masked ion implantations. The second doped semiconductor layer 60 may be amorphous or polycrystalline, and comprises one of the semiconductor materials that may be employed for the first doped semiconductor layer 44 as described above. The second doped semiconductor layer 60 may comprise the same semiconductor material as, or a different semiconductor material from, the first doped semiconductor layer 44. The thickness of the second doped semiconductor layer 60 may be from about 30 nm to about 200 nm, and typically from about 50 nm to about 120 nm, although lesser and greater thicknesses are also explicitly contemplated herein.

A dielectric gate cap layer 62 is formed directly on the second doped semiconductor layer 60. The dielectric gate cap layer 62 comprises a dielectric material such as an oxide, such as silicon oxide, or a nitride, such as silicon nitride. Preferably, the dielectric gate cap layer 62 comprises silicon nitride. The thickness of the dielectric gate cap layer 62 may be in the range from about 20 nm to about 200 nm, with a thickness from about 40 nm to about 100 nm being more typical. The dielectric gate cap layer 62 may be formed by plasma enhanced chemical vapor deposition (PECVD), high density plasma chemical vapor deposition (HDPCVD), low pressure chemical vapor deposition (LPCVD) or rapid thermal chemical vapor deposition (RTCVD).

Figure 10:
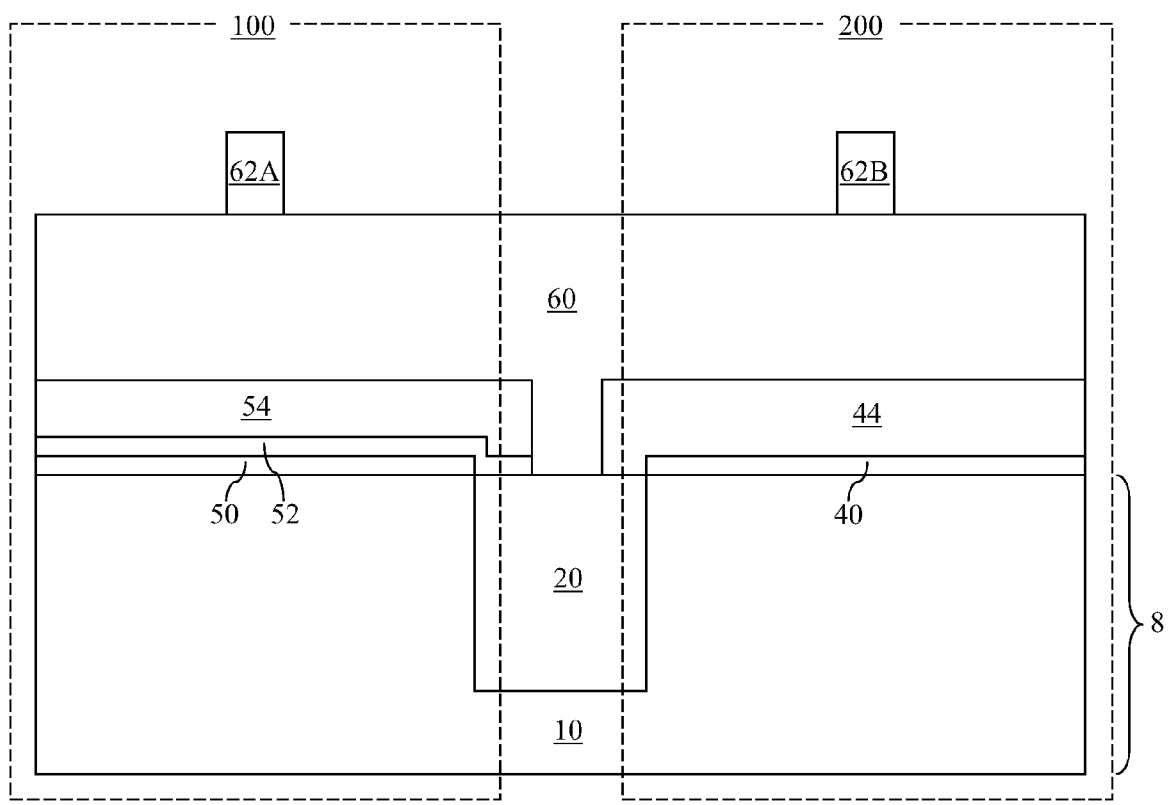

Referring to FIG. 10, a photoresist (not shown) is applied over the dielectric gate cap layer 62 and lithographically patterned in the shape of gate conductor structure to be subsequently formed. After transferring the pattern in the photoresist into the dielectric gate cap layer 62 by an anisotropic etch, the remaining portions of the dielectric gate cap layer 62 constitute a first dielectric gate cap 62A in the NFET region 100 and a second dielectric gate cap 62B in the PFET region 200. The photoresist may be subsequently removed.

Figure 11:
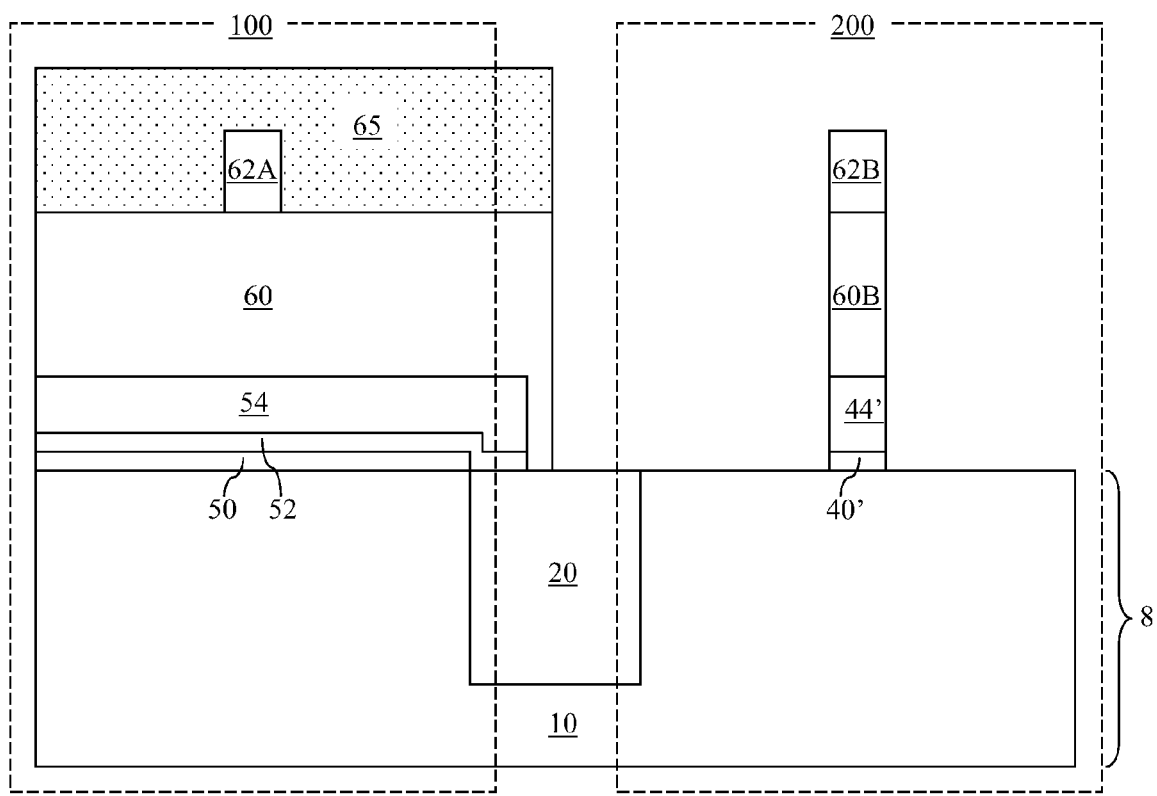

Referring to FIG. 11, a fourth photoresist 65 is applied over the first and second dielectric gate caps (62A, 62B) and the second doped semiconductor layer 60, and is lithographically patterned to expose the second gate cap 62B and the portion of the second doped semiconductor layer 60 in the PFET region 200. Employing the remaining portion of the fourth photoresist 65 and the second dielectric gate cap 62B as an etch mask, an anisotropic etch, e.g., a reactive ion etch (RIE), is performed to remove exposed portions of the second doped semiconductor layer 60, the first doped semiconductor layer 44, and the semiconductor oxide containing gate dielectric layer 40. The remaining portion of the second doped semiconductor layer 60 in the PFET region 200 constitutes a third doped semiconductor portion 60B. The remaining portion of the first doped semiconductor layer 44 in the PFET region 200 constitutes a first doped semiconductor portion 44'. The remaining portion of the semiconductor oxide containing gate dielectric layer 40 in the PFET region 200 constitutes a semiconductor oxide containing gate dielectric portion 40'. The third doped semiconductor portion 60B, the first doped semiconductor portion 44', and the semiconductor oxide containing gate dielectric portion 40' collectively constitute a second gate stack structure.

Figure 12:
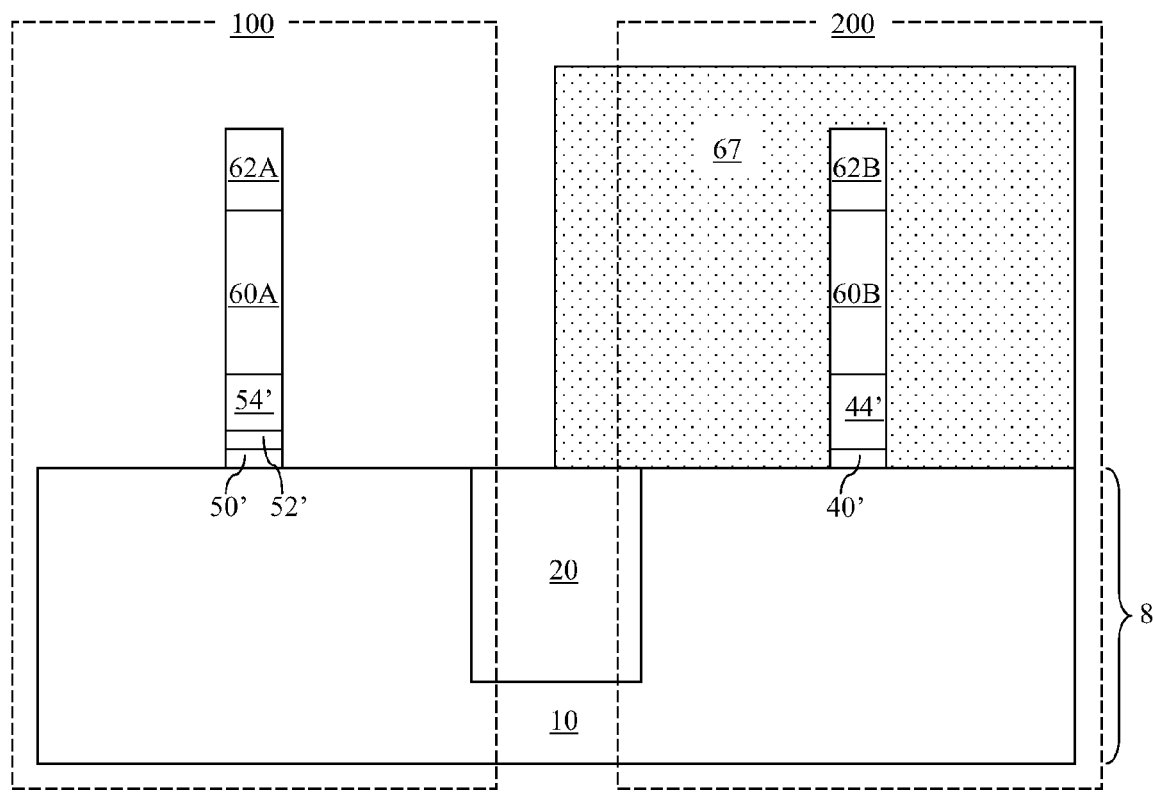

Referring to FIG. 12, a fifth photoresist 67 is applied over the exemplary semiconductor structure and lithographically patterned such that the second dielectric gate cap 62B and the second gate stack structure (40', 44', 60B) is covered with the fifth photoresist 67, while exposing the first dielectric gate cap 62A and the second doped semiconductor layer 60 in the NFET region 100. Employing the remaining portion of the fifth photoresist 65 and the first dielectric gate cap 62A as an etch mask, another anisotropic etch is performed to remove exposed portions of the second doped semiconductor layer 60, the metal gate layer 54, the high-k material layer 52, and the chemical oxide layer 50. The remaining portion of the second doped semiconductor layer 60 in the NFET region 200 constitutes a second doped semiconductor portion 60A. The remaining portion of the metal gate layer 54 in the NFET region 100 constitutes a metal gate portion 54'. The remaining portion of the high-k material layer in the NFET region 100 constitutes a high dielectric constant (high-k) material portion 52'. The remaining portion of the chemical oxide layer 50 in the NFET region 100 constitutes a chemical oxide portion 50'. The second doped semiconductor portion 60A, the metal gate portion 54', the high-k material portion 52', and the chemical oxide portion 50' collectively constitute a first gate stack structure.

Figure 13:
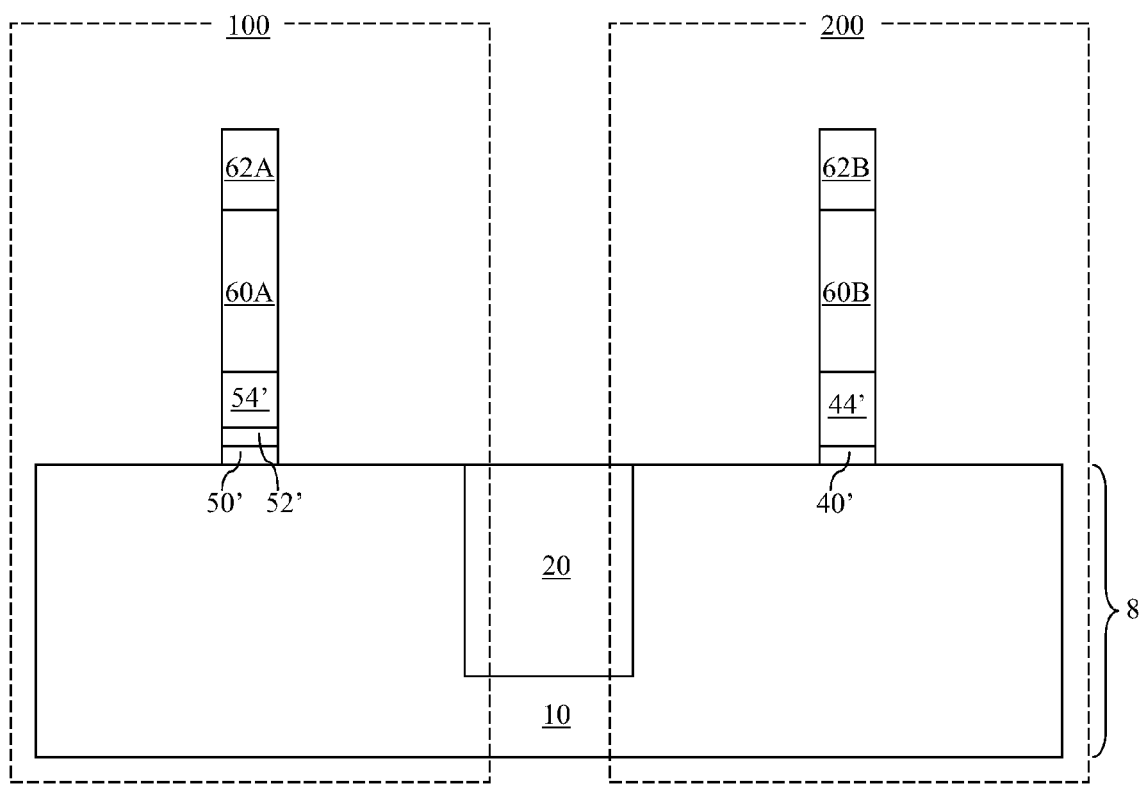

Referring to FIG. 13, the fifth photoresist 67 is removed, for example, by ashing. The exposed surfaces of the exemplary semiconductor structure may be cleaned at this step.

Figure 14:
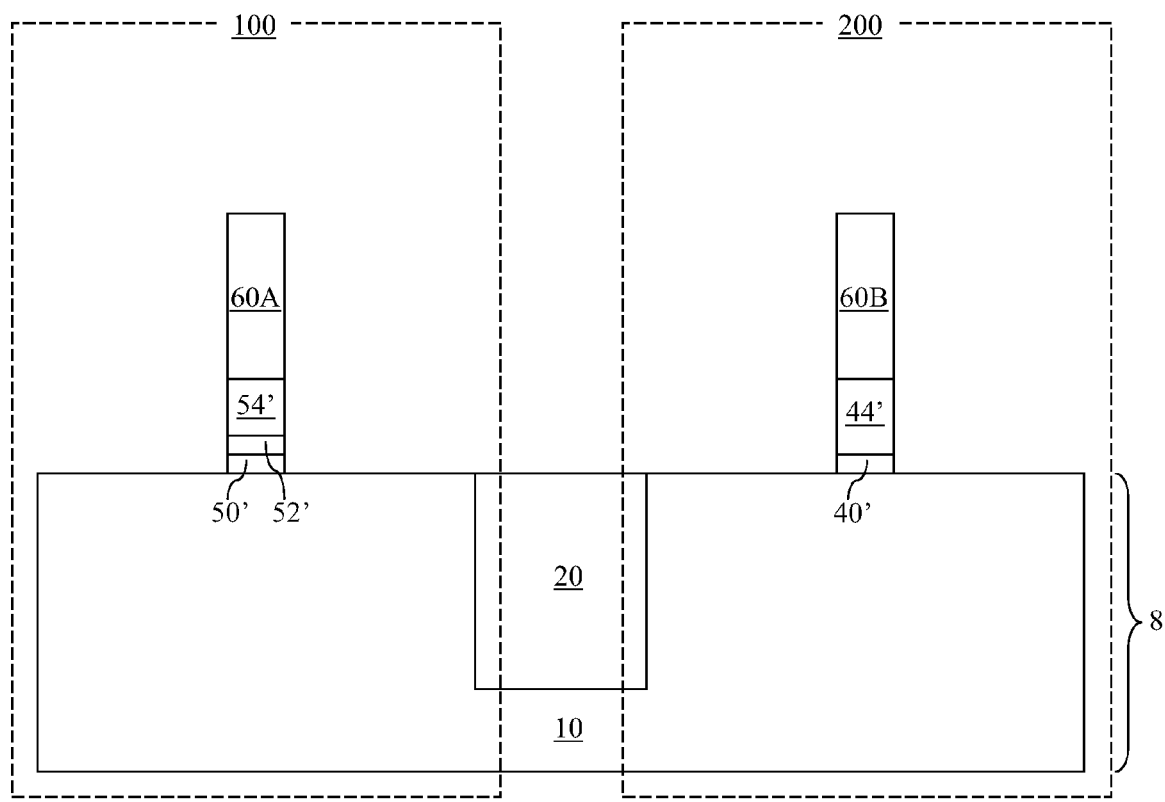

Referring to FIG. 14, the first dielectric gate cap 62A and the second dielectric gate cap 62B are removed, for example, by a wet etch selective to the first gate stack structure (50', 52', 54', 60A) and the second gate stack structure (40', 44', 60B). Preferably, the wet etch is selective to the shallow trench isolation structure 20 and the substrate semiconductor layer 10. For example, the first and second dielectric gate caps (62A, 62B) may comprise silicon nitride and the wet etch may employ a hot phosphoric acid that removes silicon nitride selective to silicon, silicon oxide, and metal.

Figure 15:
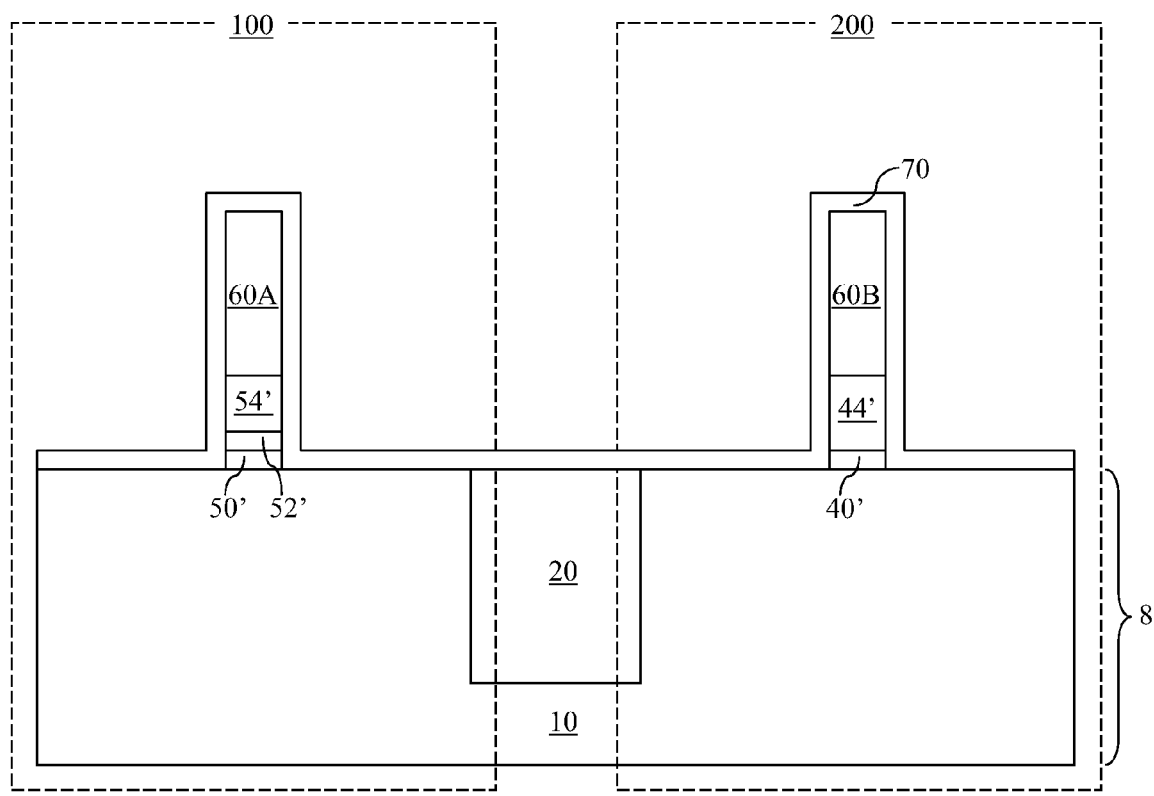

Referring to FIG. 15, an oxygen-impermeable dielectric layer 70 is formed directly on the first gate stack structure (50', 52', 54', 60A) and the second gate stack structure (40', 44', 60B), for example, by chemical vapor deposition such as LPCVD, RTCVD, PECVD, etc. The oxygen-impermeable dielectric layer 70 comprises a dielectric material that blocks diffusion of oxygen, i.e., is impermeable for the purpose of through-diffusion of oxygen. An exemplary material for the oxygen-impermeable dielectric layer 70 includes a dielectric nitride such as silicon nitride. The oxygen-impermeable dielectric layer 70 laterally abuts the sidewalls and a top surface of the first gate stack structure (50', 52', 54', 60A) and sidewalls and a top surface of the second gate stack structure (40', 44', 60B) as well as exposed top surfaces of the semiconductor substrate 8. The thickness of the oxygen-impermeable dielectric layer 70 may be from about 4 nm to about 80 nm, and preferably from about 10 nm to about 40 nm, although lesser and greater thicknesses are also contemplated herein.

Figure 16:
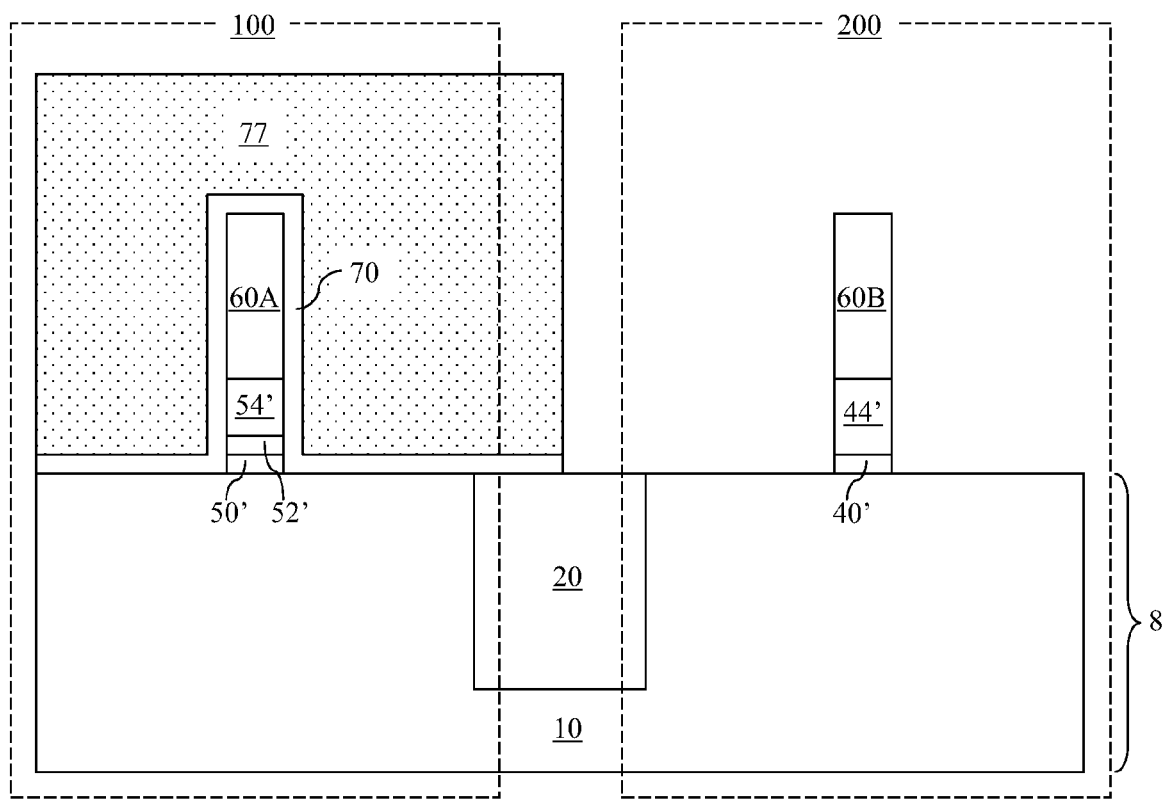

Referring to FIG. 16, a sixth photoresist 77 is applied over the oxygen-impermeable dielectric layer 70 and lithographically patterned to exposed the portion of the oxygen-impermeable dielectric layer 70 in the PFET region 200, while covering the portion of the oxygen-impermeable dielectric layer 70 in the NFET region 100. The exposed portion of the oxygen-impermeable dielectric layer 70 is subsequently etched by a wet etch or a dry etch. Preferably, the etch is selective to the substrate semiconductor layer 10 and the shallow trench isolation structure 20. In case the oxygen-impermeable dielectric layer 70 comprises silicon nitride, a wet etch chemistry including hydrofluoric acid (HF) and ethylene glycol (EG) or a dry etch chemistry employing $CHF_3$ may be employed.

Figure 17:
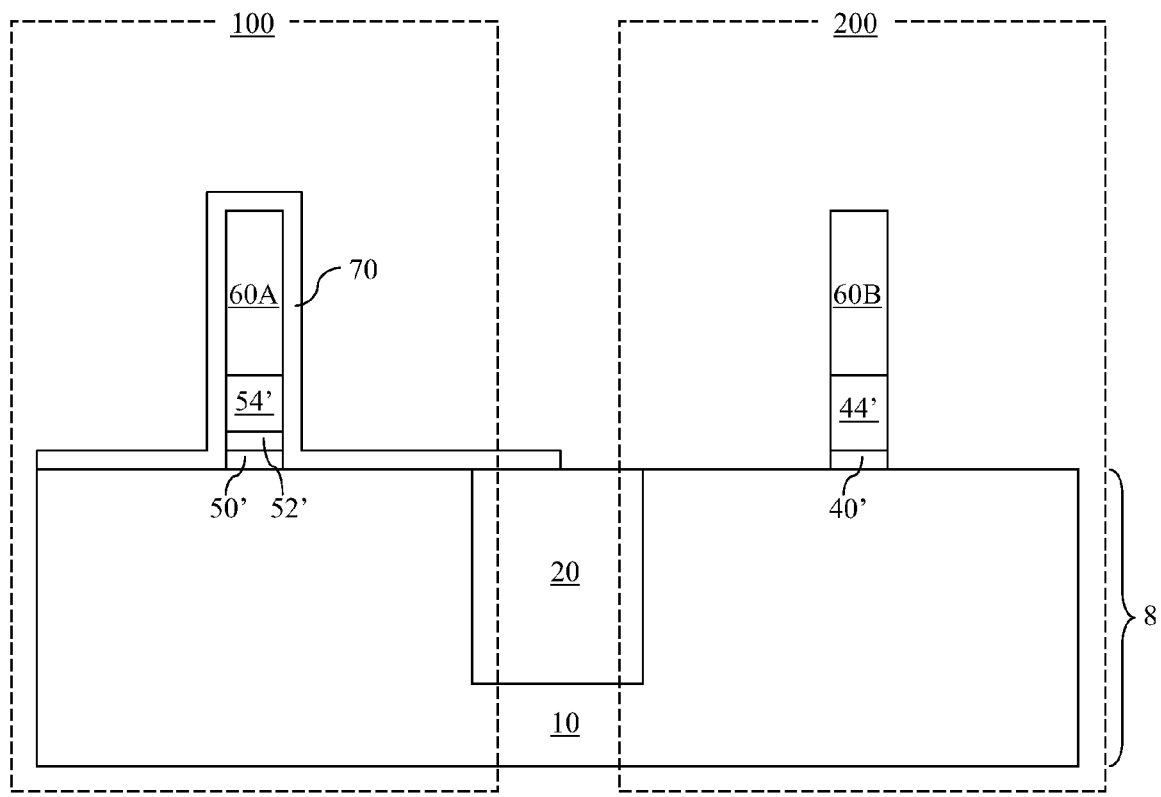

Referring to FIG. 17, the sixth photoresist 77 is removed, for example, by ashing. Exposed surfaces of the exemplary semiconductor structure may be cleaned at this step.

Figure 18:
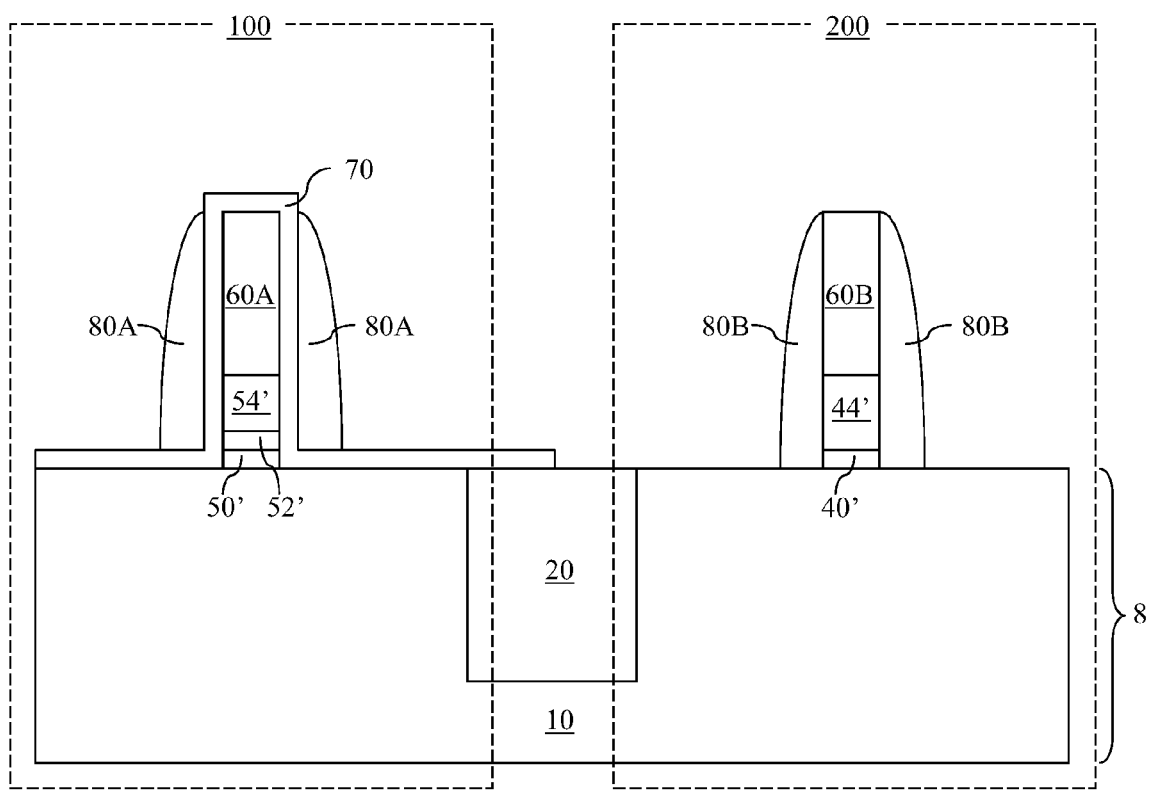

Referring to FIG. 18, a low dielectric constant (low-k) material layer (not shown) is deposited by a conformal deposition such as low pressure chemical vapor deposition (LPCVD) or rapid thermal chemical vapor deposition (RTCVD). An anisotropic etch is performed on the low-k material layer to remove horizontal portions of the low-k material layer and to form spacers from vertical portions of the low-k material layer. Remaining portions of the low-k material layer on the sidewalls of the oxygen impermeable dielectric layer 70 and on the sidewalls of the second gate stack structure (40', 44', 60B) respectively constitute a first low dielectric constant (low-k) gate spacer 80A and a second low-k gate spacer 80B.

Both the first low-k gate spacer 80A and the second low-k gate spacer 80B comprise a dielectric material having a dielectric constant less than 4.0. The first and second low-k gate spacers (80A, 80B) may comprise silicon oxide having a dielectric constant of about 3.9. Alternately, the first and second low-k gate spacers (80A, 80B) may comprise a low-k dielectric material having a dielectric constant less than 2.8. The low-k dielectric material may be porous or non-porous, and may be a spin-on low-k dielectric material such as thermosetting polyarylene ether or an organosilicate glass that is formed by chemical vapor deposition (CVD). The widths of the first low-k gate spacer 80A and the second low-k gate spacer 80B, as measured laterally at the bottom of each, may be from about 10 nm to about 100 nm, and typically from about 15 nm to about 60 nm.

Figure 19:
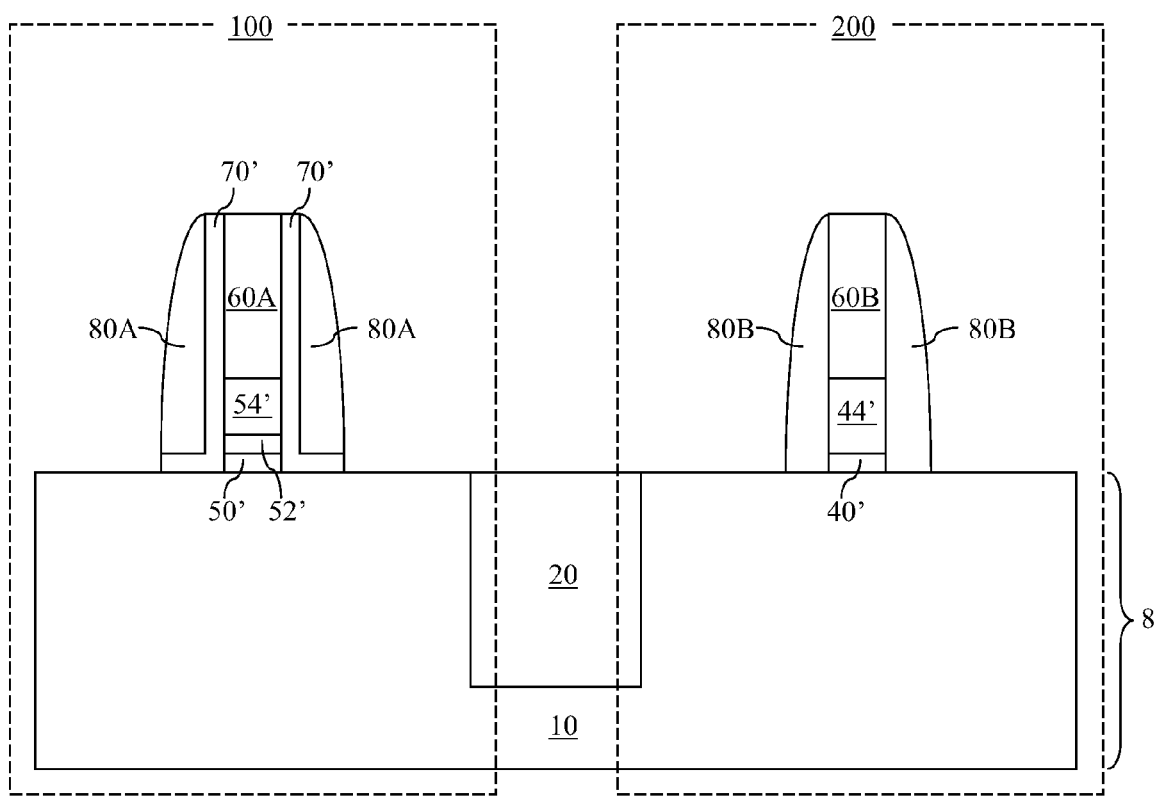

Referring to FIG. 19, horizontal portions of the oxygen-impermeable dielectric layer 70 is removed by an etch, which may be a wet etch or a dry etch. The remaining portion of the oxygen-impermeable dielectric layer 70 between the first gate stack structure (50', 52', 54', 60A) and the first low-k spacer 80A constitutes an oxygen-impermeable dielectric spacer 70'. The oxygen-impermeable dielectric spacer 70' has an L-shaped vertical cross-sectional area, laterally abuts the first gate stack structure (50', 52', 54', 60A), and vertically abuts the substrate semiconductor layer 10.

On one hand, diffusion of oxygen or other gas molecules into the high-k material portion 54' during subsequent processing steps is prevented by the oxygen-impermeable dielectric spacer 70', thus keeping the composition of the high-k material portion 54' constant. Particularly, the material of the high-k material portion 54' is not subjected to further oxidation during subsequent processing steps. Thus, the high-k material portion 54', which is the gate dielectric material of the first gate stack structure (50', 52', 54', 60A), maintains constant composition.

On the other hand, the second low-k spacer 80B laterally abuts the second gate stack structure (40', 44', 60B), providing a lower parasitic capacitance between the gate electrode, which comprises the first doped semiconductor portion 44' and the third doped semiconductor portion 60B, and the substrate semiconductor layer 10. Such reduction in the parasitic capacitance contributes to enhanced performance of a transistor comprising the second gate stack structure (40', 44', 60B) by allowing a faster operation of the transistor compared to a transistor having the same second gate structure (40', 44', 60B) and a gate spacer that comprises an oxygen-impermeable dielectric material such as silicon nitride, which has a dielectric constant of about 7.5 and consequently a higher parasitic capacitance.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   a high-k material metal gate structure to an n-type semiconductor device, and a semiconductor gate structure to a p-type semiconductor device, wherein said high-k material metal gate structure includes:
   a high dielectric constant (high-k) material portion having a dielectric constant greater than 8.0 and located on a semiconductor substrate;
   a metal gate portion comprising a metal having a composition to provide a threshold voltage for an n-type semiconductor device, said metal gate portion vertically abutting said high-k material portion;
   an oxygen-impermeable dielectric spacer laterally abutting sidewalls of said high-k material portion and said metal gate portion; and
   a first low-k spacer comprising a dielectric material having a dielectric constant less than 4.0 and laterally contacting sidewalls of said oxygen-impermeable dielectric spacer, wherein said first low-k spacer is laterally spaced from said high-k material portion and said metal gate portion by said oxygen-impermeable dielectric spacer;
   and wherein said semiconductor gate structure includes:
   a semiconductor oxide containing gate dielectric portion having a dielectric constant less than 8.0 and located directly on said semiconductor substrate;
   a doped semiconductor portion comprising a doped semiconductor material and vertically abutting said gate dielectric; and
   a second low-k gate spacer comprising said dielectric material and laterally abutting sidewalls of said semiconductor oxide containing gate dielectric portion and said doped semiconductor portion, wherein said oxygen-impermeable dielectric spacer is not present between the second low-k gate spacer and the sidewalls of the doped semiconductor portion.

2. The semiconductor structure of claim 1, wherein said high-k material portion further includes a chemical oxide portion vertically abutting said high-k material portion and said semiconductor substrate and comprising an oxide of a semiconductor material of said semiconductor substrate.

3. The semiconductor structure of claim 1, wherein said oxygen-impermeable dielectric spacer has an L-shaped vertical cross-sectional area and vertically abuts said semiconductor substrate.

4. The semiconductor structure of claim 1, wherein said oxygen-impermeable dielectric spacer comprises silicon nitride.

5. The semiconductor structure of claim 1, wherein said low-k gate spacer comprises silicon oxide.

6. The semiconductor structure of claim 1, wherein said low-k gate spacer comprises a low-k dielectric material having a dielectric constant less than 2.8.

7. The semiconductor structure of claim 1, wherein said high-k material portion comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from about 0.5 to about 3 and each value of y is independently from 0 to about 2.

8. The semiconductor structure of claim 1, wherein said metal gate portion comprises one of TiN, ZrN, HfN, VN, NbN, TaN, WN, TiAlN, TaCN, W, Ta, Ti, other conductive refractory metal nitrides, and an alloy thereof.

9. The semiconductor structure of claim 1, wherein said high-k material metal gate structure further includes a second doped semiconductor portion comprising a doped semiconductor and vertically abutting said metal gate portion.

10. The semiconductor structure of claim 9, wherein said semiconductor gate structure further includes a third doped semiconductor portion comprising said doped semiconductor and vertically abutting said doped semiconductor portion.

11. The semiconductor structure of claim 10, wherein said third doped semiconductor portion and said doped semiconductor portion comprise different materials.

12. A semiconductor structure comprising:
a high-k material metal gate structure to an n-type semiconductor device, and a semiconductor gate structure to a p-type semiconductor device, wherein said high-k material metal gate structure includes:
a high dielectric constant (high-k) material portion having a dielectric constant greater than 8.0 and located on a semiconductor substrate;
a metal gate portion comprising a metal having a composition to provide a threshold voltage for an n-type semiconductor device, said metal gate portion vertically abutting said high-k material portion;
a first doped semiconductor portion vertically abutting the metal gate portion;
an oxygen-impermeable dielectric spacer laterally abutting sidewalls of said high-k material portion and said metal gate portion; and
a first low-k spacer comprising a dielectric material having a dielectric constant less than 4.0 and laterally contacting sidewalls of said oxygen-impermeable dielectric spacer, wherein said first low-k spacer is laterally spaced from said high-k material portion and said metal gate portion by said oxygen-impermeable dielectric spacer;
and wherein said semiconductor gate structure includes:
a semiconductor oxide containing gate dielectric portion having a dielectric constant less than a dielectric constant of silicon oxynitride and located directly on said semiconductor substrate;
a second doped semiconductor portion comprising a doped semiconductor material and vertically abutting said gate dielectric;
a third doped semiconductor portion vertically abutting the second doped semiconductor portion, wherein the third doped semiconductor portion of the semiconductor gate structure and the first doped semiconductor portion of the high-k material metal gate structure have an identical composition; and
a second low-k gate spacer comprising said dielectric material and laterally abutting sidewalls of said semiconductor oxide containing gate dielectric portion and said second and third doped semiconductor portion, wherein said oxygen-impermeable dielectric spacer is not present between the second low-k gate spacer and the sidewalls of the doped semiconductor portion.

* * * * *